(12) United States Patent
Takahashi et al.

(10) Patent No.: US 9,887,154 B2
(45) Date of Patent: Feb. 6, 2018

(54) SEMICONDUCTOR DEVICE AND METHOD OF MANUFACTURING THE SEMICONDUCTOR DEVICE

(71) Applicant: Mitsubishi Electric Corporation, Tokyo (JP)

(72) Inventors: Takuya Takahashi, Tokyo (JP); Yoshitaka Otsubo, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/678,369

(22) Filed: Apr. 3, 2015

(65) Prior Publication Data
US 2015/0303126 A1 Oct. 22, 2015

(30) Foreign Application Priority Data

Apr. 21, 2014 (JP) .................................. 2014-087648
Dec. 18, 2014 (JP) .................................. 2014-255991

(51) Int. Cl.
*H01L 23/498* (2006.01)
*H01L 23/053* (2006.01)
(Continued)

(52) U.S. Cl.
CPC ...... *H01L 23/49894* (2013.01); *H01L 23/053* (2013.01); *H01L 23/10* (2013.01);
(Continued)

(58) Field of Classification Search
None
See application file for complete search history.

(56) References Cited

U.S. PATENT DOCUMENTS 5,686,758 A 11/1997 Arai et al.
5,793,106 A * 8/1998 Yasukawa ........... H01L 23/3121
257/706
(Continued)

FOREIGN PATENT DOCUMENTS

JP H05-304248 A 11/1993
JP H07-326711 A 12/1995
(Continued)

OTHER PUBLICATIONS

An Office Action issued by Chinese Patent Office dated Jun. 5, 2017, which corresponds to Chinese Patent Application No. 201510190997.6 and is related to U.S. Appl. No. 14/678,369 with Partial English Translation.
(Continued)

*Primary Examiner* — William Coleman
*Assistant Examiner* — Kien Ly
(74) *Attorney, Agent, or Firm* — Studebaker & Brackett PC

(57) ABSTRACT

A semiconductor device includes an insulating substrate including a substrate, a metal pattern formed on an upper surface of the substrate, and a metal film formed on a lower surface of the substrate, a semiconductor element fixed on the metal pattern, a case surrounding the metal pattern and having a contact portion maintained in contact with the upper surface of the substrate, and an adhesive with which the case and a portion of the upper surface of the substrate outside a portion maintained in contact with the contact portion are bonded together, wherein a plurality of through holes are formed in a peripheral portion of the case, the through holes extending vertically through the case, and wherein the metal film exists in at least part of a place right below the contact portion.

19 Claims, 14 Drawing Sheets

(51) Int. Cl.
*H01L 23/10* (2006.01)
*H01L 23/40* (2006.01)
*H01L 23/04* (2006.01)
*H01L 23/373* (2006.01)
*H01L 23/00* (2006.01)

(52) U.S. Cl.
CPC ...... *H01L 23/3735* (2013.01); *H01L 23/4006* (2013.01); *H01L 23/04* (2013.01); *H01L 24/29* (2013.01); *H01L 24/32* (2013.01); *H01L 24/48* (2013.01); *H01L 24/49* (2013.01); *H01L 2224/291* (2013.01); *H01L 2224/32227* (2013.01); *H01L 2224/48105* (2013.01); *H01L 2224/48159* (2013.01); *H01L 2224/48227* (2013.01); *H01L 2224/49175* (2013.01); *H01L 2224/73265* (2013.01); *H01L 2224/83424* (2013.01); *H01L 2924/00014* (2013.01); *H01L 2924/05042* (2013.01); *H01L 2924/1033* (2013.01); *H01L 2924/10253* (2013.01); *H01L 2924/10254* (2013.01); *H01L 2924/10272* (2013.01); *H01L 2924/13055* (2013.01); *H01L 2924/15787* (2013.01); *H01L 2924/19107* (2013.01)

(56) References Cited

U.S. PATENT DOCUMENTS

| | | | | |
|---|---|---|---|---|
| 7,957,148 | B1* | 6/2011 | Gallarelli | H01L 23/32 165/80.3 |
| 8,159,822 | B2 | 4/2012 | Kanschat et al. | |
| 2001/0015478 | A1 | 8/2001 | Tsunoda et al. | |
| 2006/0060982 | A1* | 3/2006 | Ikawa | H01L 23/49861 257/779 |
| 2009/0039498 | A1* | 2/2009 | Bayerer | H01L 23/3735 257/700 |
| 2009/0219106 | A1* | 9/2009 | Terawaki | H01P 1/36 333/24.2 |
| 2009/0261472 | A1* | 10/2009 | Bayerer | H01L 24/06 257/719 |
| 2010/0127371 | A1* | 5/2010 | Tschirbs | H01L 23/13 257/684 |
| 2010/0302741 | A1* | 12/2010 | Kanschat | H01L 23/24 361/717 |
| 2012/0187430 | A1* | 7/2012 | West | H01L 25/0753 257/88 |
| 2013/0322025 | A1* | 12/2013 | Shinkai | H01L 23/50 361/728 |
| 2014/0231981 | A1* | 8/2014 | Kojima | H01L 23/4093 257/690 |
| 2015/0289356 | A1* | 10/2015 | Izuo | H01L 23/13 361/709 |

FOREIGN PATENT DOCUMENTS

| | | |
|---|---|---|
| JP | H08-236667 A | 9/1996 |
| JP | H09-134983 A | 5/1997 |
| JP | H10-093016 A | 4/1998 |
| JP | 2000-133769 A | 5/2000 |
| JP | 2001-284524 A | 10/2001 |
| JP | 2003-218317 A | 7/2003 |
| JP | 2008-270262 A | 11/2008 |
| JP | 2012-156211 A | 8/2012 |

OTHER PUBLICATIONS n. Office Action, "Notification of Reasons of Refusal", issued by Japanese Patent Office on Oct. 3, 2017, which rresponds to Japanese Patent Application No. 2014-255991 and is related to U.S. Patent Application No. 4/678,369 with English Machine Translation. X.

* cited by examiner

SEMICONDUCTOR DEVICE AND METHOD OF MANUFACTURING THE SEMICONDUCTOR DEVICE

BACKGROUND OF THE INVENTION

Field of the Invention

The present invention relates to a semiconductor device used, for example, for control of a large current and a method of manufacturing the semiconductor device.

Background Art

Japanese Patent Laid-Open No. 7-326711 discloses a semiconductor device of a baseless structure having a case fixed on an insulating substrate. The insulating substrate includes a substrate (a ceramic plate), a metal pattern formed on an upper surface of the substrate and a metal film formed on a lower surface of the substrate.

An adhesive is used when the insulating substrate including the substrate, the metal pattern formed on the upper surface of the substrate and the metal film formed on the lower surface of the substrate is bonded to the case. This bonding is performed by maintaining a cure base plate in intimate contact with the metal film and by supplying heat from the cure base plate to the adhesive through the metal film.

The semiconductor device having the insulating substrate and the case bonded to each other is fixed on a heat sink. Improving heat dissipation from the semiconductor device requires maintaining the metal film and heat sink in close contact with each other.

Thus, there is a need to bring the metal film into close contact with the cure base plate when the adhesive is used and there is also a need to bring the metal film into close contact with the heat sink when the semiconductor device is fixed on the heat sink. In some cases, therefore, a contact portion to be brought into contact with the upper surface of the substrate is provided as a portion of the case. With the contact portion, the substrate is pressed toward the cure base plate or the heat sink to bring the metal film and the cure base plate or the heat sink into close contact with each other.

In some cases, no metal film portion exists right below the contact portion and the lower surface of the substrate is exposed right below the contact portion. In such a case, there is a problem that the substrate is cracked when a force larger than designed exerted from the contact portion to the substrate, for example, due to a warp of the case or the insulating substrate.

SUMMARY OF THE INVENTION

In view of the above-described problem, an object of the present invention is to provide a semiconductor device capable of reducing the possibility of cracking of the substrate and a method of manufacturing the semiconductor device.

The features and advantages of the present invention may be summarized as follows.

According to one aspect of the present invention, a semiconductor device includes an insulating substrate including a substrate, a metal pattern formed on an upper surface of the substrate, and a metal film formed on a lower surface of the substrate, a semiconductor element fixed on the metal pattern, a case surrounding the metal pattern and having a contact portion maintained in contact with the upper surface of the substrate, and an adhesive with which the case and a portion of the upper surface of the substrate outside a portion maintained in contact with the contact portion are bonded together. A plurality of through holes are formed in a peripheral portion of the case, the through holes extending vertically through the case, and the metal film exists in at least part of a place right below the contact portion.

According to another aspect of the present invention, a method of manufacturing a semiconductor device includes a preparatory step of forming an insulating substrate having an upward convex warp by forming a metal pattern on an upper surface of a substrate and by forming on a lower surface of the substrate a metal film thicker than the metal pattern, a mount step of pressing a central portion of the insulating substrate downward with a pressing portion of a case while the insulating substrate is on a cure base plate, thereby bringing the metal film into surface contact with the cure base plate, and bringing a contact portion formed on the case so as to surround the metal pattern into contact with the upper surface of the substrate, and a bonding step of bonding the case and the substrate to each other by curing an adhesive between the case and a portion of the upper surface of the substrate outside a portion in contact with the contact portion, heat being supplied from the cure base plate to the adhesive to cure the adhesive.

According to another aspect of the present, a semiconductor device includes an insulating substrate including a substrate, a metal pattern formed on an upper surface of the substrate, and a metal film formed on a lower surface of the substrate, a semiconductor element fixed on the metal pattern, a case having a contact portion maintained in contact with an upper surface of the metal pattern, the case surrounding the semiconductor element, and an adhesive with which a portion of the upper surface of the substrate outside the contact portion and the case are bonded to each other, wherein a plurality of through holes formed so as to extend vertically through the case are formed in peripheral portions of the case.

Other and further objects, features and advantages of the invention will appear more fully from the following description.

DETAILED DESCRIPTION OF THE PREFERRED EMBODIMENTS

Figure 1:
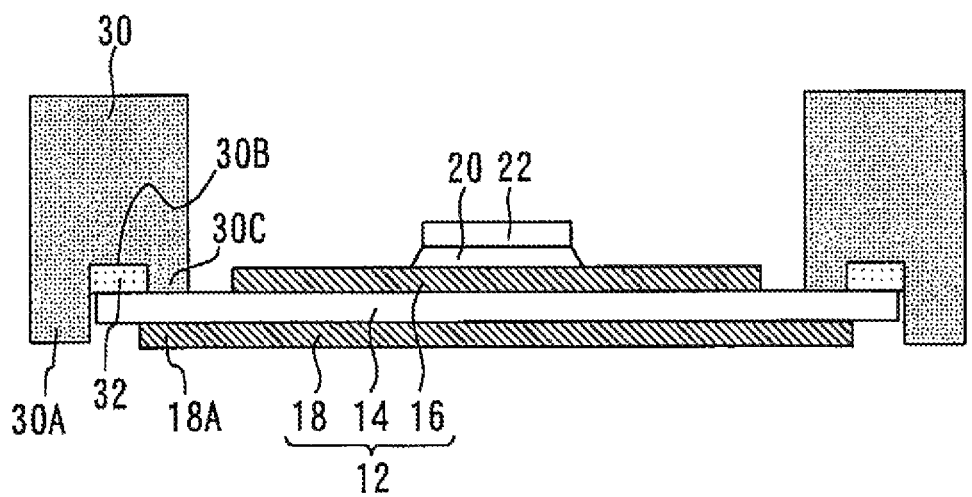
FIG. 1 is a sectional view of a semiconductor device according to a first embodiment.

A semiconductor device and a semiconductor device manufacturing method according to an embodiments of the present invention will be described with reference to the drawings. Components identical or corresponding to each other are indicated by the same reference characters and repetition of some descriptions may be avoided.

First Embodiment

FIG. 1 is a sectional view of a semiconductor device 10 according to a first embodiment of the present invention. The semiconductor device 10 has an insulating substrate 12. The insulating substrate 12 has a substrate 14, a metal pattern 16 formed on an upper surface of the substrate 14, and a metal film 18 formed on a lower surface of the substrate 14. The substrate 14 is formed of a ceramic for example. Each of the metal pattern 16 and the metal film 18 is formed of aluminum for example.

A semiconductor element 22 is fixed on the metal pattern 16 with solder 20. The semiconductor element 22 is an insulated gate bipolar transistor (IGBT), a diode, or the like. The semiconductor element 22 is not particularly limited to this. Wires or the like are connected to the semiconductor element 22 and the metal pattern 16 as desired, thereby enabling electrical connection between the semiconductor element 22 and external points.

The semiconductor device 10 is provided with a case 30 formed of a polyphenylene sulfide (PPS) resin for example. The case 30 has an outer wall portion 30A, a recess 30B and a contact portion 30C. The outer wall portion 30A is an outermost portion of the case 30. The outer wall portion 30A surrounds an insulating substrate 12. The contact portion 30C is in contact with an upper surface of the substrate 14 while surrounding the metal pattern 16. The recess 30B is positioned between the outer wall portion 30A and the contact portion 30C. An adhesive 32 is provided in the recess 30B. With the adhesive 32, the case 30 and a portion of the upper surface of the substrate 14 outside the portion in contact with the contact portion 30C are bonded together.

A portion of the metal film 18 exists right below the contact portion 30C. The portion of the metal film 18 right below the contact portion 30C is referred to as a portion right below 18A. The semiconductor device 10 uses a baseless structure having no base plate.

Figure 2:
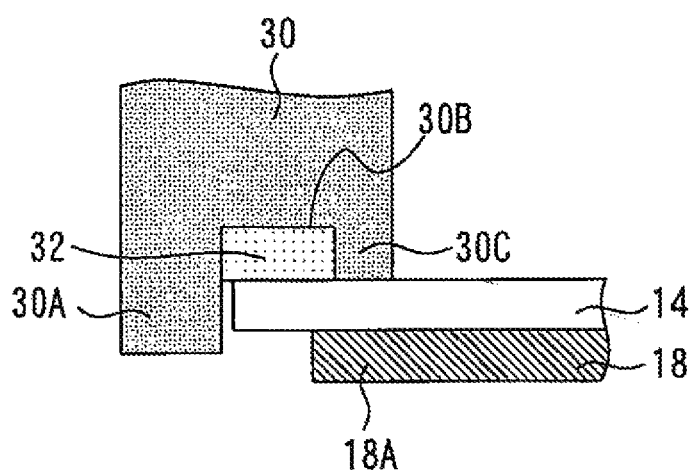
FIG. 2 is an enlarged view of the contact portion shown in FIG. 1.

FIG. 2 is an enlarged view of the contact portion 30C shown in FIG. 1 and portions existing around the contact portion 30C. The metal film 18 is fully formed just below the contact portion 30C. That is, the entire portion of the lower surface of the substrate 14 right below the contact portion 30C is covered with the metal film 18. Right below the adhesive 32, at least part of the lower surface of the substrate 14 is exposed to the outside.

Figure 3:
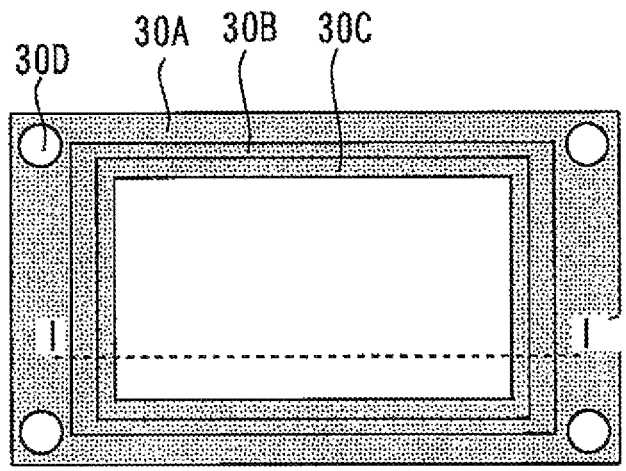
FIG. 3 is a bottom view of the case.

FIG. 3 is a bottom view of the case 30. The recess 30B is provided inside and along the outer wall portion 30A. The contact portion 30C is provided inside and along the recess 30B. Each of the recess 30B and the contact portion 30C is rectangular as viewed in plan. Through holes 30D are formed in peripheral end portions of the case 30 at the four corners. The through holes 30D are holes through which screws are passed when the case 30 is mounted on an external device. The case 30 shown in FIG. 1 corresponds to the section taken long I-I' in FIG. 3.

Figure 4:
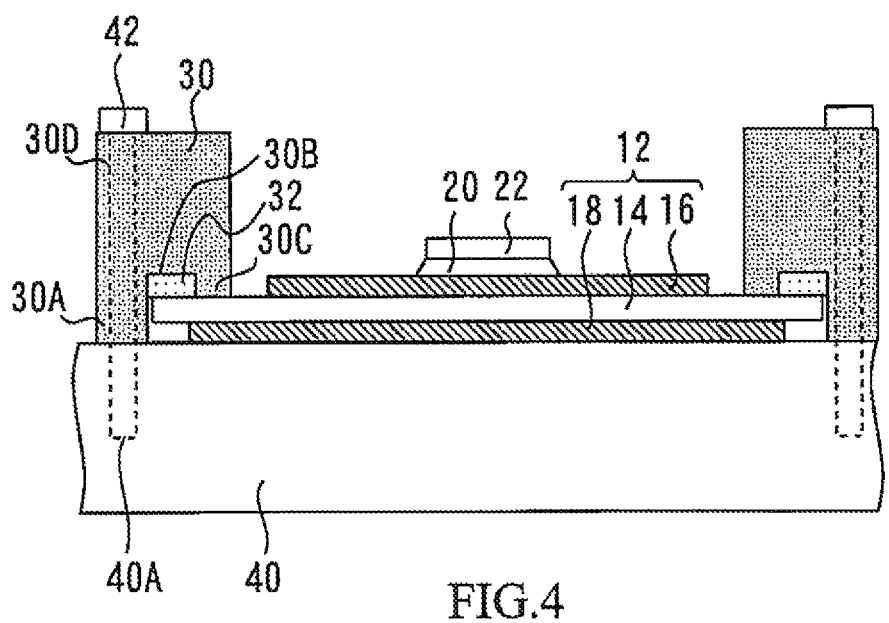
FIG. 4 is a sectional view showing the case and the insulating substrate.

A method of manufacturing the semiconductor device 10 will be described. FIG. 4 is a sectional view showing a bonding step in which the case 30 and the insulating substrate 12 are bonded to each other with the adhesive 32. In the bonding step, a cure base plate 40 having screw holes 40A formed therein is used. The through holes 30D extending vertically through the case are indicated by broken lines. Screws 42 are first passed through the through holes 30D in the case 30 and fastened into the screw holes 40A. The outer wall portion 30A is thereby brought into contact with the cure base plate 40. At this time, the contact portion 30C abuts on the upper surface of the substrate 14 and presses the substrate 14 downward. The metal film 18 is thereby maintained in close contact with the cure base plate 40.

Subsequently, heat is supplied from the cure base plate 40 to the insulating substrate 12 to heat-cure the adhesive 32. The insulating substrate 12 and the case 30 are thereby bonded together. Subsequently, the screws 42 are unscrewed and the semiconductor device 10 is removed from the cure base plate 40. The semiconductor device 10 is thus manufactured.

Figure 5:
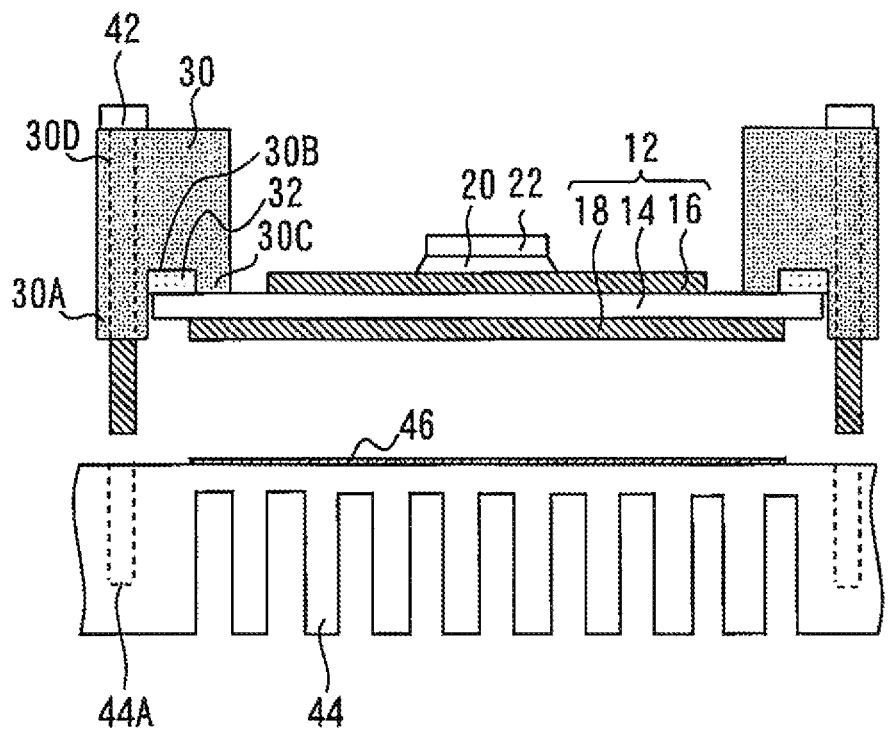
FIG. 5 is a sectional view showing fixing of the semiconductor device on a heat sink.

A method of using the semiconductor device 10 will be described. The semiconductor device 10 is used while being fixed on a heat sink. FIG. 5 is a sectional view showing fixing of the semiconductor device 10 on a heat sink 44. Heat-dissipating grease 46 is applied on the upper surface of the heat sink 44. The screws 42 passed through the through holes 30D of the case 30 are fastened into screw holes 44A in the heat sink 44. At this time, the contact portion 30C abuts on the upper surface of the substrate 14 and presses the substrate 14 downward. The metal film 18 and the heat sink 44 are thereby maintained in close contact with each other through the heat-dissipating grease 46. The semiconductor device 10 is used by being fixed on the heat sink in this way.

As described above, the substrate 14 is pressed downward with the contact portion 30C when the semiconductor device is fixed on the cure base plate 40 or the heat sink 44. Therefore, there has been a problem that the substrate 14 is cracked by the force exerted from the contact portion 30C in the case where no metal film 18 exists right below the contact portion 30C while only the substrate 14 exists. To solve this problem, the metal film 18 (portion right below 18A) is formed right below the contact portion 30C in the semiconductor device 10 according to the first embodiment of the present invention. The substrate 14 (insulating substrate 12) can thus be made more resistant to cracking than in the case where no metal film exits right below the contact portion 30C.

In the state where the semiconductor device 10 is fixed on the heat sink 44, the portion right below 18A receives downward force from the contact portion 30C and the metal film 18 can therefore be maintained in close contact with the heat sink 44 through the heat-dissipating grease 46. Thus, in the semiconductor device 10 according to the first embodiment of the present invention, the breakage resistance of the semiconductor device 10 can be increased and heat dissipation from the semiconductor device 10 can also be improved.

In the semiconductor device 10 according to the first embodiment of the present invention, a portion of the metal film 18 is formed right below the adhesive 32, as shown in FIG. 2. This portion, however, may be removed.

Figure 6:
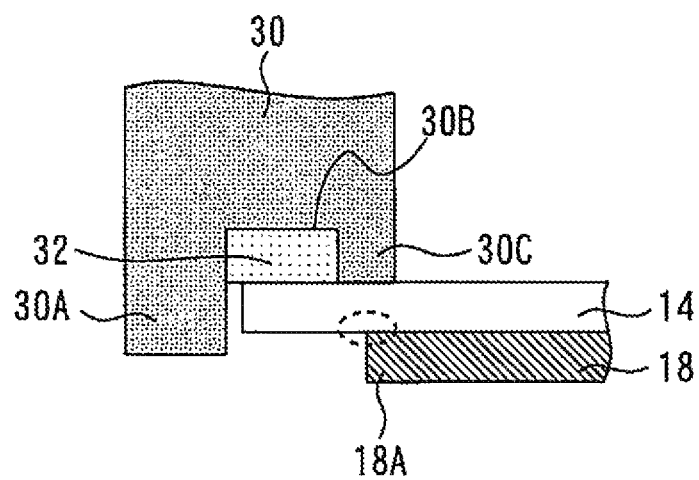
FIG. 6 is a sectional view of a portion of a semiconductor device.

FIG. 6 is a sectional view of a portion of a semiconductor device according to a modified example. FIG. 6 shows covering with the metal film of only part of the lower surface of the substrate 14 right below the contact portion 30C. That is, the lower surface (portion indicated by broken line) of the substrate 14 right below the contact portion 30C includes a portion covered with the metal film 18 and a portion exposed to the outside. If the metal film 18 exists in at least part of a place right below the contact portion 30C as described above, the possibility of cracking of the insulating substrate 12 can be reduced in comparison with the case where no metal film exist right below the contact portion 30C.

It is preferable that the substrate 14 be formed of SiN. By forming the substrate of SiN, the breakage resistance (resistance to cracking) of the substrate 14 can be increased about twice that in the case where the substrate is formed of alumina or AlN.

The heat-dissipating grease 46 may be replaced with a different heat-dissipating material. A thermal interface material (TIM) agent may be applied on the surface of the metal film 18. A TIM agent is a material having heat conductivity higher than that of heat-dissipating grease and solid at ordinary temperature. If a TIM agent is applied on the surface of the metal film, the heat-dissipating grease on the heat sink surface can be omitted.

The semiconductor element 22 is ordinarily formed of silicon. However, the semiconductor element 22 may alternatively be formed of a wide-bandgap semiconductor having a bandgap larger than that of silicon. The wide-bandgap semiconductor is, for example, silicon carbide, a gallium nitride-based material or diamond.

These modifications can be applied to semiconductor devices and semiconductor device manufacturing methods according to embodiments described below. The semiconductor devices and semiconductor device manufacturing methods according to the embodiments described below have a number of commonalities with the first embodiment and will therefore be described mainly with respect to points of difference from the first embodiment.

Second Embodiment

Figure 7:
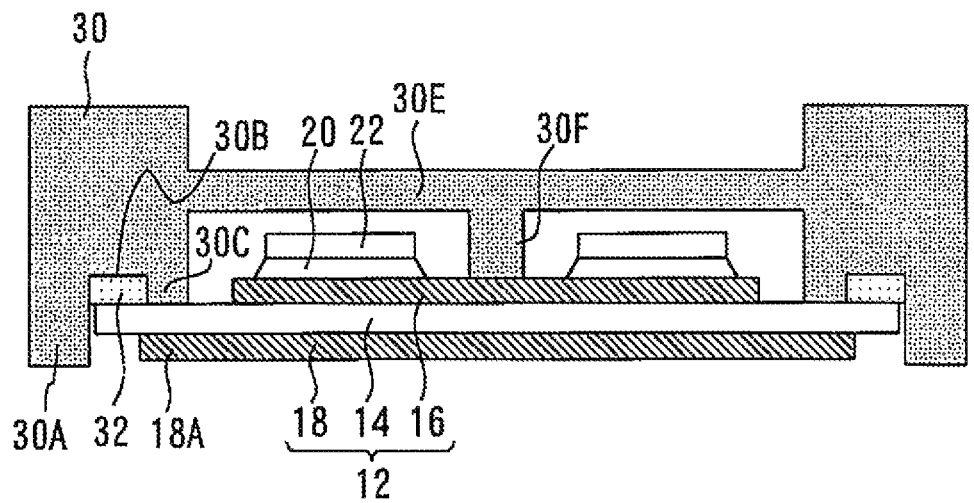
FIG. 7 is a sectional view of a semiconductor device according to a second embodiment.
Figure 8:
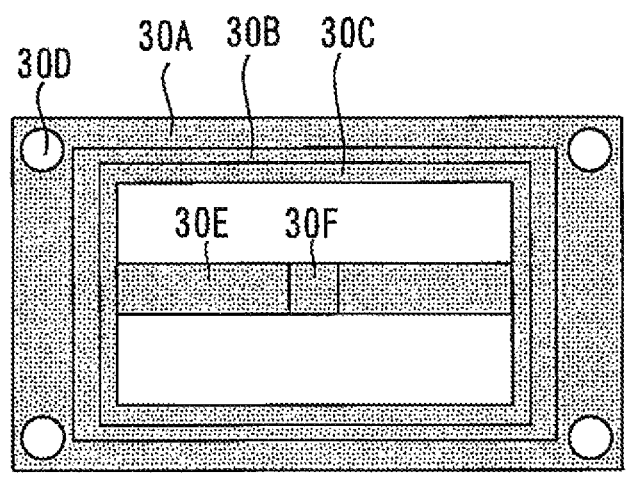
FIG. 8 is a bottom view of the case.

FIG. 7 is a sectional view of a semiconductor device 50 according to a second embodiment of the present invention. The case 30 is provided with an extension portion 30E and a pressing portion 30F. The extension portion 30E is provided so as to connect two inner walls of the case 30. The pressing portion 30F is a portion connected to the extension portion 30E and extending downward. The pressing portion 30F is in contact with the upper surface of the metal pattern 16. The pressing portion 30F may be in contact with the upper surface of the substrate 14. FIG. 8 is a bottom view of the case 30 shown in FIG. 7. The pressing portion 30F is provided in a place surrounded by the contact portion 30C as viewed in plan.

When the semiconductor device 50 is fixed on a heat sink (or a cure base plate), both the contact portion 30C and the pressing portion 30F are brought into contact with the insulating substrate 12 to press the insulating substrate 12 downward. Therefore, a stress caused in the insulating substrate 12 can be dispersed in comparison with the case where the insulating substrate 12 is pressed downward only with the contact portion 30C, thus enabling prevention of cracking of the insulating substrate 12.

Referring to FIG. 7, the pressing portion 30F and the insulating substrate 12 are in contact with each other. At a stage before fixing of the semiconductor device 50 on the heat sink, however, there is a possibility of the pressing portion 30F not being in contact with the insulating substrate 12 due to a warp or the like of the insulating substrate 12. That is, there is a possibility of a downward convex warp in the insulating substrate 12. When there is a downward convex warp in the insulating substrate 12, a central portion of the insulating substrate is brought into close contact with the heat sink. This state is preferable to the state where the insulating substrate is flat. The insulating substrate cannot be warped so as to be upward convex. Therefore, the problem of an upward convex warp in the insulating substrate inhibiting a central portion of the insulating substrate from being brought into close contact with the heat sink can be avoided.

During use of the semiconductor device, a change in temperature of the insulating substrate due to a power cycle or the like results in a displacement of the insulating substrate. If the displacement of the insulating substrate is large, there is a possibility of pumping out, i.e., the heat-dissipating grease being forced out of the position between the insulating substrate 12 and the heat sink. In the semiconductor device 50 according to the second embodiment of the present invention, however, the displacement of the insulating substrate 12 is limited by the pressing portion 30F, thereby limiting pumping out. The degradation of solder 20 or the like can also be limited thereby. The reliability of the semiconductor device can thus be improved.

Third Embodiment

Figure 9:
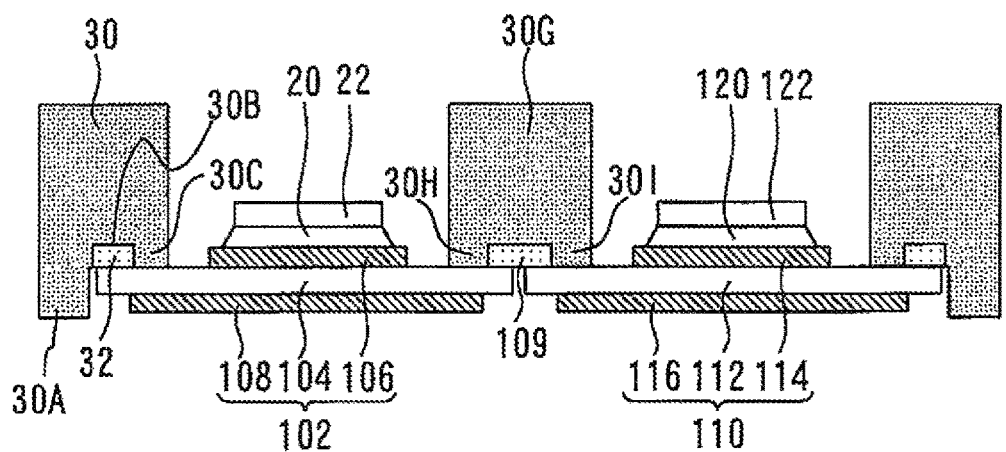
FIG. 9 is a sectional view of a semiconductor device according to a third embodiment.

FIG. 9 is a sectional view of a semiconductor device 100 according to a third embodiment of the present invention. The semiconductor device 100 is provided with a plurality of insulating plates. More specifically, a first insulating substrate 102 and a second insulating substrate 110 laterally disposed side by side are provided. The first insulating substrate 102 includes a substrate 104, a metal pattern 106 and a metal film 108. The second insulating substrate 110 includes a substrate 112, a metal pattern 114 and a metal film 116. A semiconductor element 122 is fixed to the metal pattern 114 by solder 120.

The case 30 has a right-above-boundary portion 30G provided right above the boundary between the first insulating substrate 102 and the second insulating substrate 110. The right-above-boundary portion 30G includes an additional contact portion 30H in contact with the substrate 104 of the first insulating substrate 102 and an additional contact portion 30I in contact with the substrate 112 of the second insulating substrate 110. Further, a recess for containing an adhesive 109 is formed in the right-above-boundary portion 30G. With the adhesive 109, the substrate 104 and the right-above-boundary portion 30G are bonded together and the substrate 112 and the right-above-boundary portion 30G are bonded together.

Figure 10:
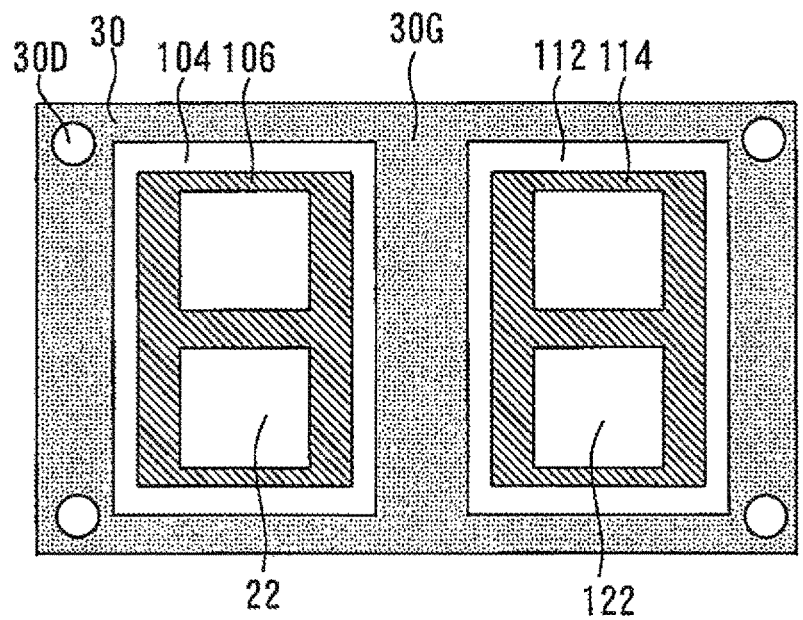
FIG. 10 is a plan view of the semiconductor device.

FIG. 10 is a plan view of the semiconductor device 100. The right-above-boundary portion 30G is provided so as to connect opposed inner wall portions of the case to each other. Accordingly, (the left half of) the contact portion 30C and the additional contact portion 30H surround the metal pattern 106, while (the right half of) the contact portion 30C and the additional contact portion 30I surround the metal pattern 114. As a result, a peripheral portion of the substrate 104 is pressed downward by (the left half of) the contact portion 30C and the additional contact portion 30H and a peripheral portion of the substrate 112 is pressed downward by (the right half of) the contact portion 30C and the additional contact portion 30I.

Thus, the semiconductor device 100 incorporating a plurality of insulating substrates can be provided by providing the right-above-boundary portion 30G in the case 30. While two insulating substrates are provided in the third embodiment of the present invention, the number of insulating substrates is not particularly specified, though it is, of course, a plural number. While the right-above-boundary portion 30G is disposed across the semiconductor device, it may alternatively be provided in any other form, e.g., crisscross form as viewed in plan.

Figure 11:
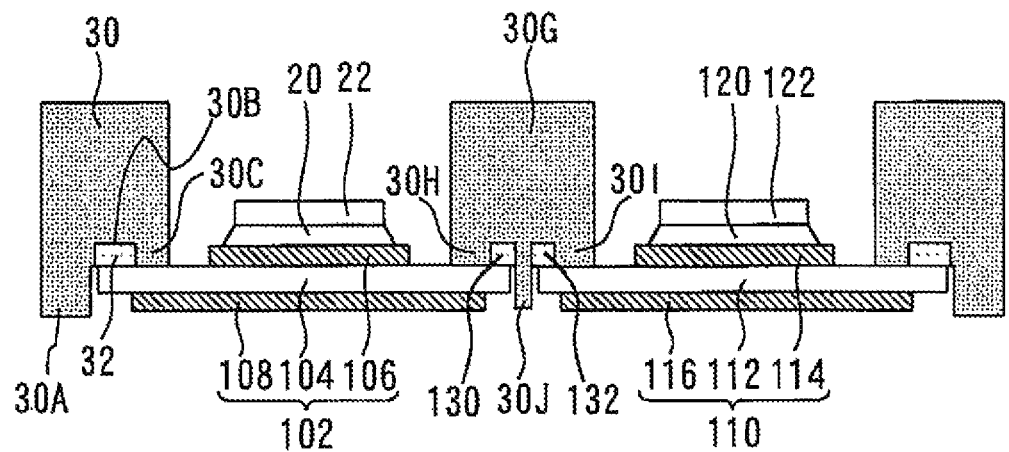
FIG. 11 is a sectional view of a semiconductor device according to a modified example.

FIG. 11 is a sectional view of a semiconductor device according to a modified example. The case 30 has a partition portion 30J positioned between the first insulating substrate 102 and the second insulating substrate 110. A recess for containing an adhesive 130 and a recess for containing an adhesive 132 are formed in the right-above-boundary portion 30G. In the semiconductor device according to this modified example, the partition portion 30J prevents cracking of the substrates which may be caused by direct contact between the insulating substrates.

Fourth Embodiment

Figure 12:
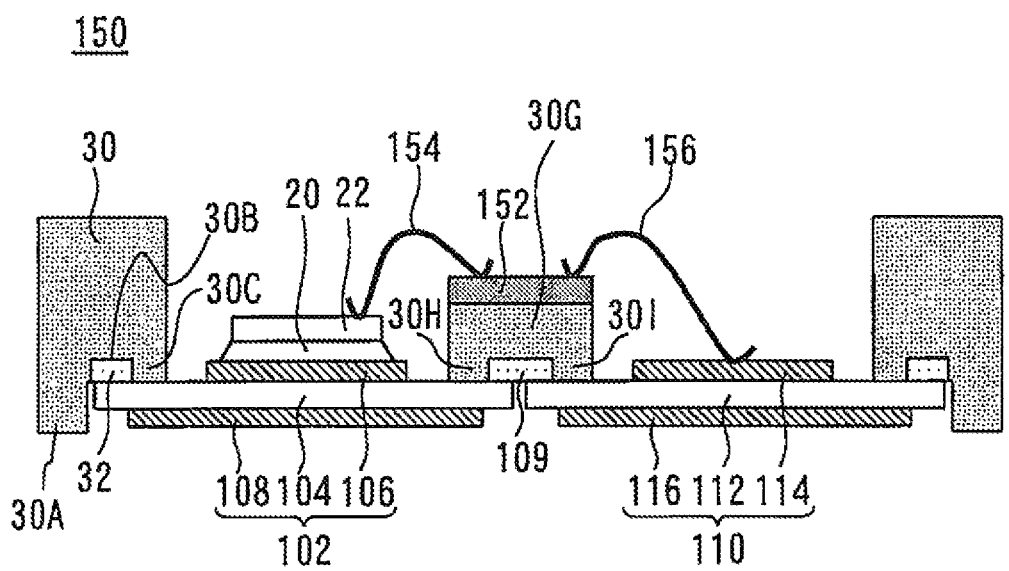
FIG. 12 is a sectional view of a semiconductor device according to a fourth embodiment.
Figure 13:
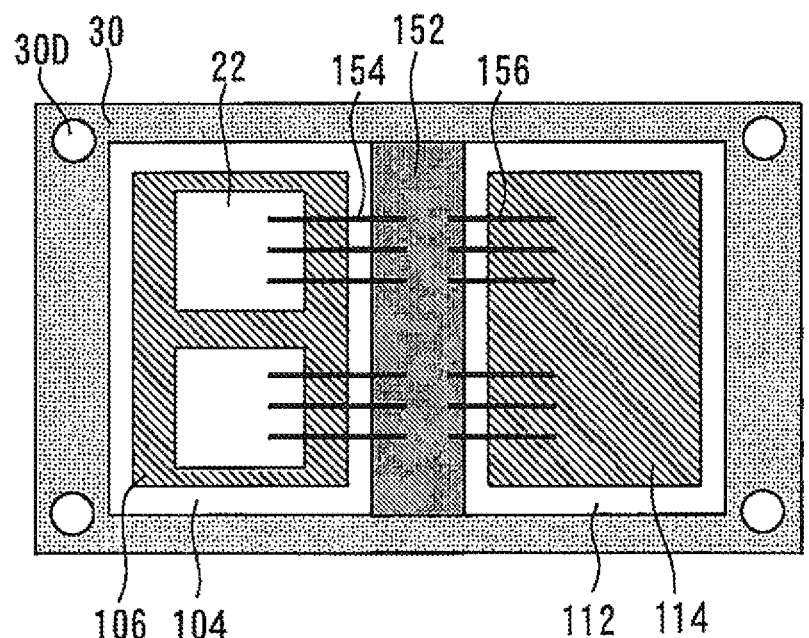
FIG. 13 is a plan view of the semiconductor device.

FIG. 12 is a sectional view of a semiconductor device 150 according to a fourth embodiment of the present invention. An electrode 152 is provided on the right-above-boundary portion 30G. The electrode 152 and the semiconductor element 22 are connected to each other by wires 154. The electrode 152 and the metal pattern 114 are connected to each other by wires 156. FIG. 13 is a plan view of the semiconductor device shown in FIG. 12. The electrode 152 is provided so as to connect opposed inner wall portions of the case to each other. Thus, the electrode 152 is provided on the right-above-boundary portion 30G to enable effective use of a space above the right-above-boundary portion 30G, and the construction of the semiconductor device 150 is suitable for reducing the size of the device.

Also, the rigidity of the case 30 is improved because of the provision of the electrode 152 in contact with the right-above-boundary portion 30G. Therefore, the heat-dissipating grease can be spread by applying a large force from the case 30 to the substrates 104 and 112 when the semiconductor device 150 is fixed on the heat sink. By spreading the heat-dissipating grease, the thermal contact resistance between the insulating substrate (first insulating substrate 102 and second insulating substrate 110) and heat sink is reduced.

Fifth Embodiment

Figure 14:
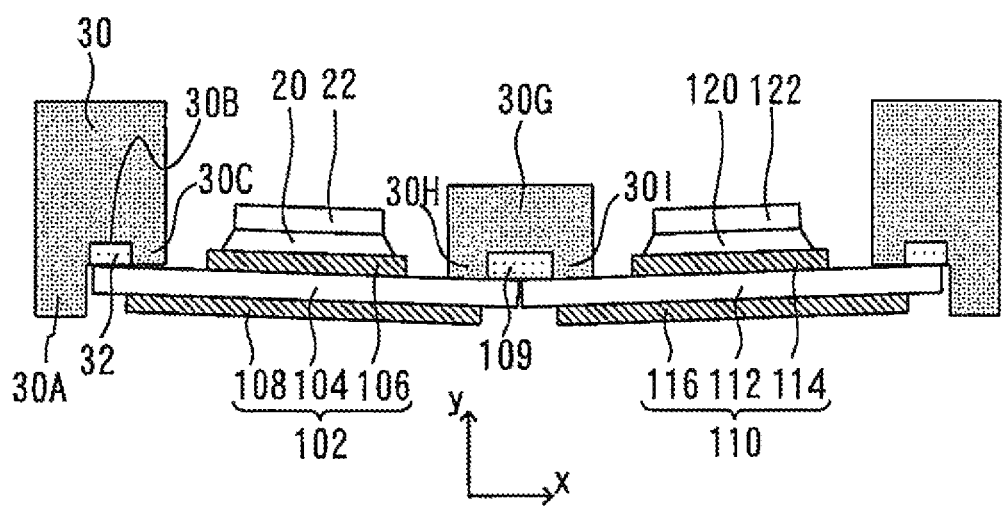
FIG. 14 is a sectional view of a semiconductor device according to a fifth embodiment.

FIG. 14 is a sectional view of a semiconductor device 200 according to a fifth embodiment of the present invention.

The additional contact portion 30H to be brought into contact with the upper surface of the first insulating substrate 102 and the additional contact portion 30I to be brought into contact with the upper surface of the second insulating substrate 110 extend further downward relative to the contact portion 30C. That is, the y-coordinate of the lower ends of the additional contact portions 30H and 30I is smaller than that of the lower end of the contact portion 30C in the coordinate system shown in FIG. 14. The first insulating substrate 102 and the second insulating substrate 110 are disposed side by side in a lateral direction (x-axis direction).

Figure 15:
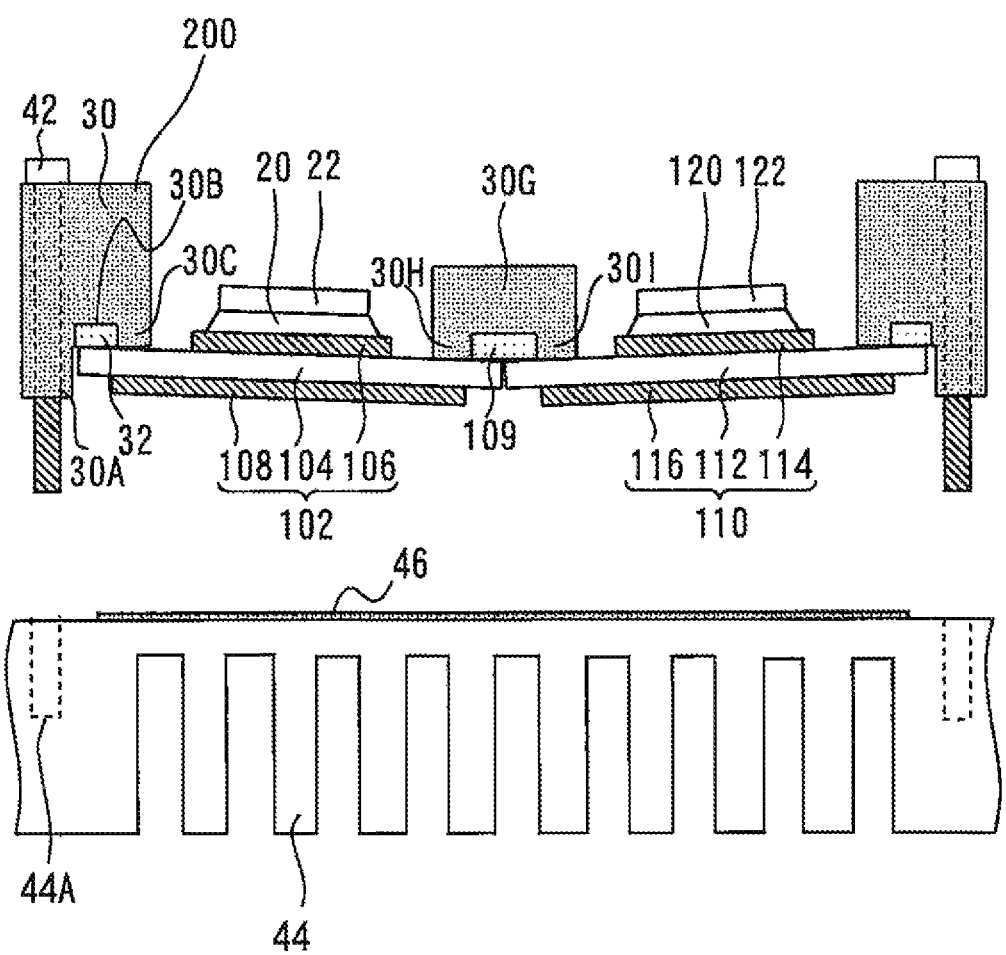
FIG. 15 is a sectional view of the semiconductor device and other members.

FIG. 15 is a sectional view of the semiconductor device 200 and other members when the semiconductor device 200 is mounted on the heat sink 44. As the semiconductor device 200 is brought closer to the heat sink 44, portions of the metal films 108 and 116 right below the additional contact portions 30H and 30I (hereinafter referred to as inner metal film portions) are first brought into contact with the heat-dissipating grease 46, and portions of the metal films 108 and 116 right below the additional contact portion 30C (hereinafter referred to as outer metal film portions) are thereafter brought into contact with the heat-dissipating grease 46. In this process, part of the heat-dissipating grease 46 is spread from the positions right below the inner metal film portions toward the outer metal film portions, so that the thickness of the heat-dissipating grease 46 is optimized and the thermal contact resistance is reduced. After the completion of fastening with screws 42, the entire surfaces of the metal films 108 and 116 are in intimate contact with the heat-dissipating grease 46.

For example, if the lower end of the contact portion and the lower ends of the additional contact portions are at the same height (y-coordinate), the outer metal film portions closer to the screws than the inner metal film portions are pressed against the heat-dissipating grease more strongly than the inner metal film portions are, when fastening with the screws is completed. In this case, there is a possibility of the degree of intimate contact between the inner metal film portions and the heat-dissipating grease being not sufficiently high.

In the semiconductor device 200 according to the fifth embodiment of the present invention, the additional contact portions 30H and 30I extend further downward relative to the contact portion 30C and the inner metal film portions are therefore pressed against the heat sink by a force larger than a force by which the outer metal film portions are pressed against the heat sink. The inner metal film portions can thereby be brought into intimate contact with the heat-dissipating grease.

Moreover, the right-above-boundary portion 30G has certain flexibility since it is a beam connected between inner wall portions of the case 30 as described above. Therefore, there is substantially no possibility of either substrate 104 or 112 being broken by being pressed by the additional contact portion 30H or 30I with an excessive force.

Sixth Embodiment

Figure 16:
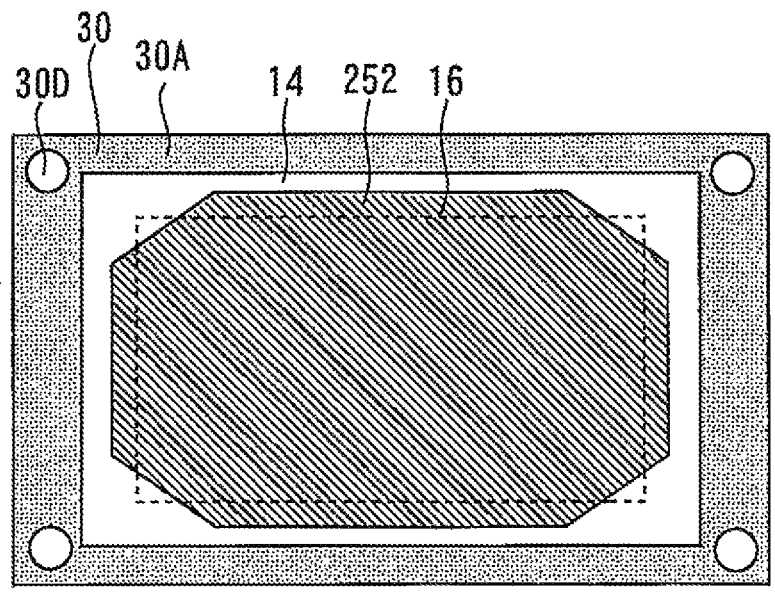
FIG. 16 is a bottom view of a semiconductor device according to a sixth embodiment.

FIG. 16 is a bottom view of a semiconductor device 250 according to a sixth embodiment of the present invention. A metal film 252 is octagonal as viewed in plan. The contour of the metal pattern 16 is indicated by a broken line. The metal pattern 16 is rectangular as viewed in plan. The corners of the metal film 252 are formed by being kept out of places right below the corners of the metal pattern 16. Accordingly, the metal film 252 and the metal pattern 16 are formed in such a way that the corners of the metal film 252 and the corners of the metal pattern 16 are not superposed on each other as viewed in plan.

Stresses produced in portions of the substrate 14 in contact with the corners of the metal film are larger than those produced in other portions of the substrate 14. Also, stresses produced in portions of the substrate 14 in contact with the corners of the metal pattern are larger than those produced in other portions of the substrate 14. That is, larger forces are exerted on the substrate from the corners of the metal film and the metal pattern. Therefore, if the corners of the metal pattern exist right below the corners of the metal film, stresses are concentrated in the substrate and may cause a crack or breakage of the substrate.

In the sixth embodiment of the present invention, therefore, forming of the corners of the metal film 252 right below the metal pattern 16 is avoided. Stresses produced in the substrate 14 due to the metal film 252 and stresses produced in the substrate 14 due to the metal pattern 16 can be dispersed.

The shapes of the metal film and the metal pattern are not particularly specified, as long as placement of the corners of the metal film right below the corners of the metal pattern is avoided. Each of the metal pattern and the metal film may be, for example, polygonal as viewed in plan.

Seventh Embodiment

Figure 17:
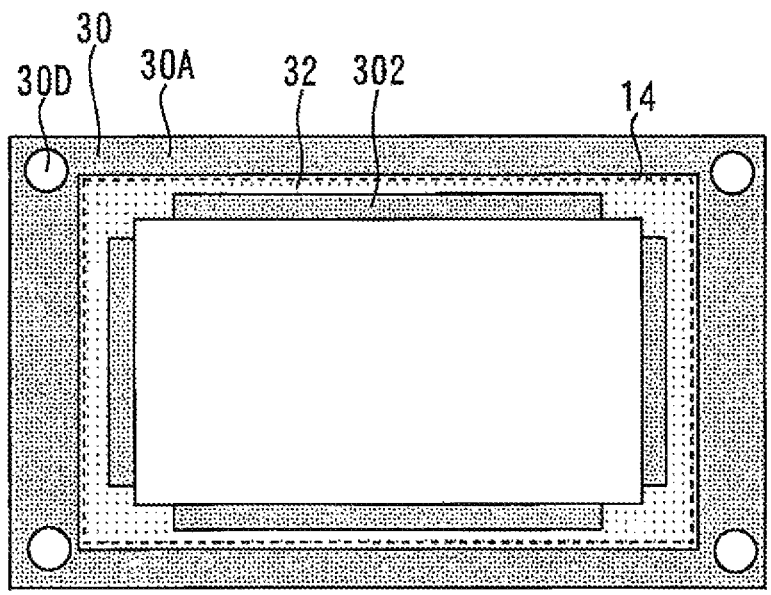
FIG. 17 is a bottom view of case and other components of a seventh embodiment.
Figure 18:
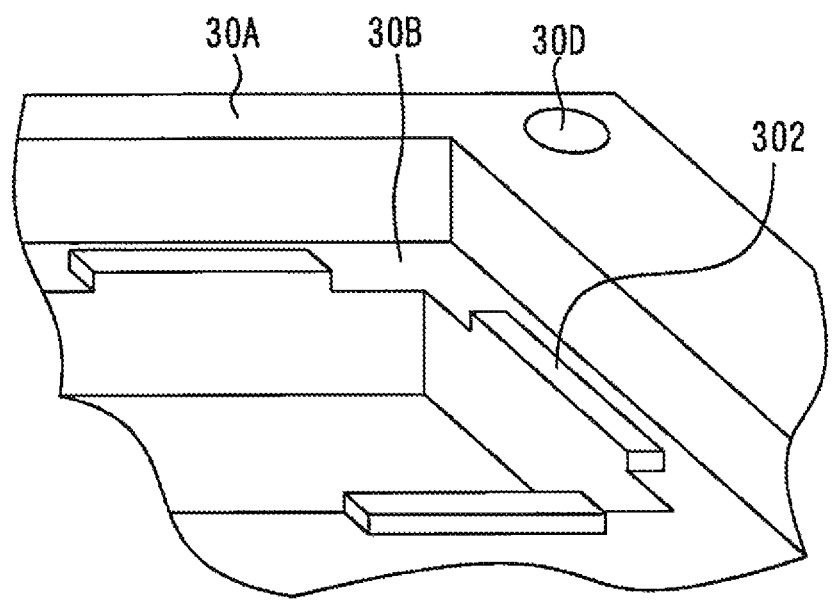
FIG. 18 is a perspective view of the case.

FIG. 17 is a bottom view of case and other components of a seventh embodiment of the present invention. While in the first embodiment the contact portion is formed so as to be rectangular as viewed in plan, portions formed along four straight lines as viewed in plan are provided as contact portions 302 in the seventh embodiment. The substrate 14 whose contour is indicated by a broken line in FIG. 17 is brought into contact with the contact portions 302. The contact portions 302 are thereby caused to abut on the upper surface of the substrate 14 without contacting corner portions of the substrate 14. FIG. 18 is a perspective view of the case.

When the contact portion contacts corner portions of the substrate, large forces are exerted on the corner portions of the substrate from the contact portion and may cause a crack or breakage of the substrate. In the seventh embodiment of the present invention, the contact portions 302 are made so as not to contact corner portions of the substrate. More specifically, the contact portions 302 contact peripheral end portions of the substrate 14 while avoiding contact with corner portions of the substrate 14, thereby reducing the possibility of cracking or breakage of the substrate 14.

The substrate is not particularly specified, as long as it is polygonal as viewed in plan. For example, if the substrate is pentagonal as viewed in plan, the contact portions are formed so as to contact the substrate while avoiding contact with five corner portions of the substrate. Thus, various modifications are possible, as long as each contact portion has such a configuration as to contact a peripheral end portion of the substrate while avoiding contact with corner portions of the substrate.

Eighth Embodiment

Figure 19:
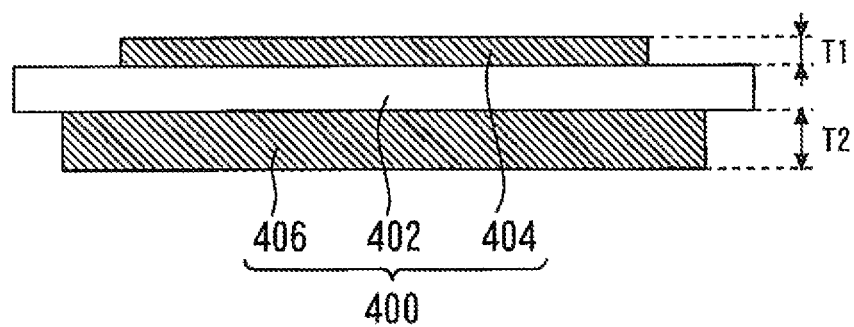
FIG. 19 is a sectional view of an insulating substrate.
Figure 20:
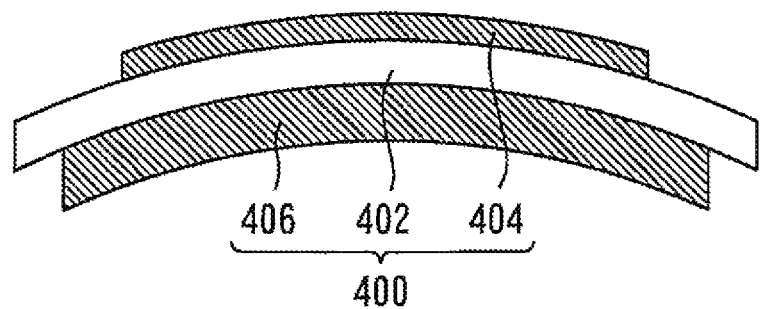
FIG. 20 shows an insulating substrate warped so as to be upward convex.

A method of manufacturing a semiconductor device according to an eighth embodiment of the present invention will be described. First, an insulating substrate is formed. FIG. 19 is a sectional view of an insulating substrate 400. A metal pattern 404 is formed on the upper surface of the substrate 402 and a metal film 406 thicker than the metal pattern 404 is formed on the lower surface of the substrate 402. FIG. 19 shows the state where the thickness T2 of the metal film 406 is larger than the thickness T1 of the metal pattern 404. Each of the metal pattern 404 and the metal film 406 is formed at a high temperature and shrinks when the temperature of the metal pattern 404 or the metal film 406 is returned to ordinary temperature. Since the metal film 406 is thicker than the metal pattern 404, it produces a larger compressive stress in the substrate 402 in comparison with the metal pattern 404. As a result, the insulating substrate 400 is warped so as to be upward convex, as shown in FIG. 20. The process step of forming the insulating substrate 400 shown in FIG. 20 is referred to as a preparatory step.

Figure 21:
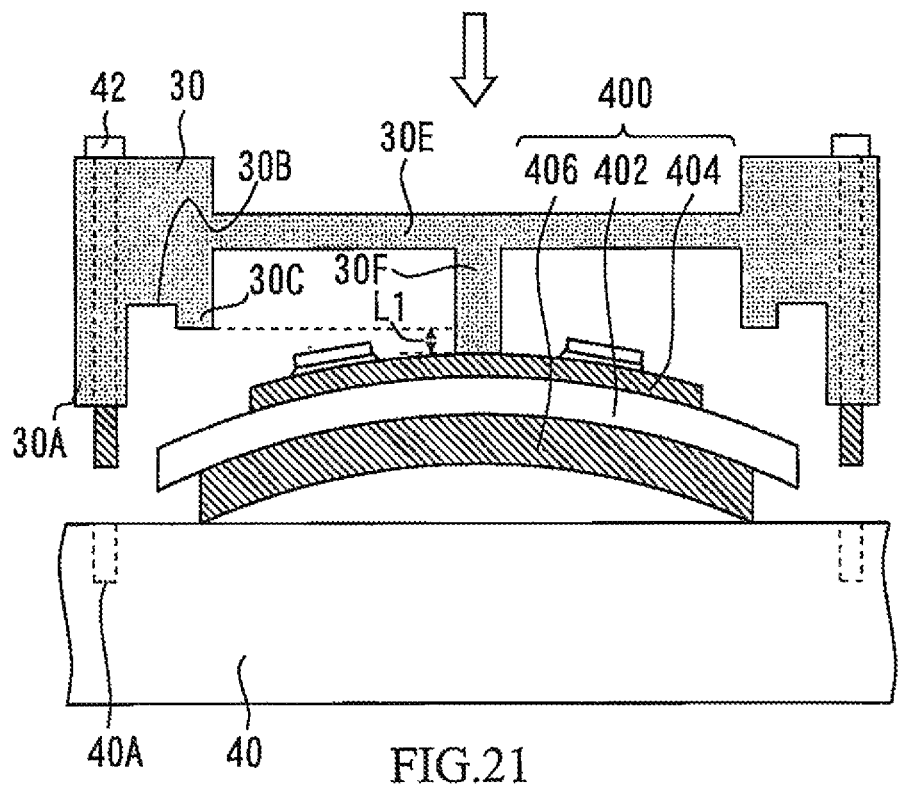
FIG. 21 shows the case, insulating substrate, and the cure base plate.
Figure 22:
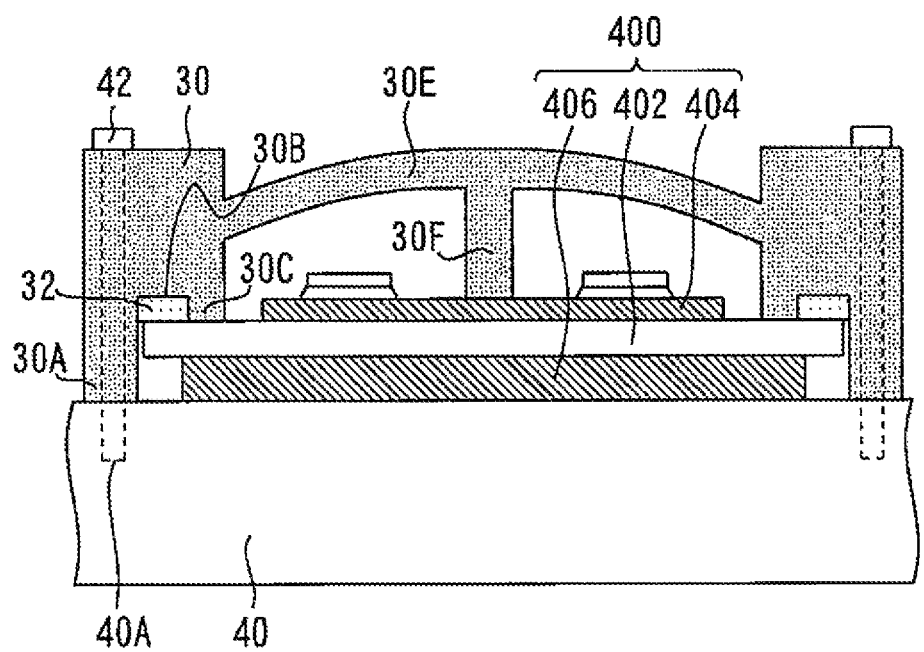
FIG. 22 shows the case, insulating substrate, and the cure base plate.

Next, the insulating substrate 400 is placed on the cure base plate. In this state, a central portion of the insulating substrate is pressed downward with the pressing portion of the case. More specifically, the case 30 is moved toward the cure base plate 40 (in the direction of the arrow), as shown in FIG. 21. The bottom surface of the pressing portion 30F is positioned lower by a distance L1 than the bottom surface of the contact portion 30C. The distance L1 is larger by about 200 μm than the thickness T1 of the metal pattern 404. The central portion of the insulating substrate 400 is pressed downward with the pressing portion 30F to gradually reduce the amount of warp of the insulating substrate 400. As shown in FIG. 22, after the completion of fastening with the screws 42, the metal film 406 is brought into surface contact with the cure base plate 40, and the contact portion 30C formed on the case 30 so as to surround the metal pattern 404 is brought into contact with the upper surface of the substrate 402. Also, the extension portion 30E is warped so as to be upward convex. This process step is referred to as a mount step.

Figure 23:
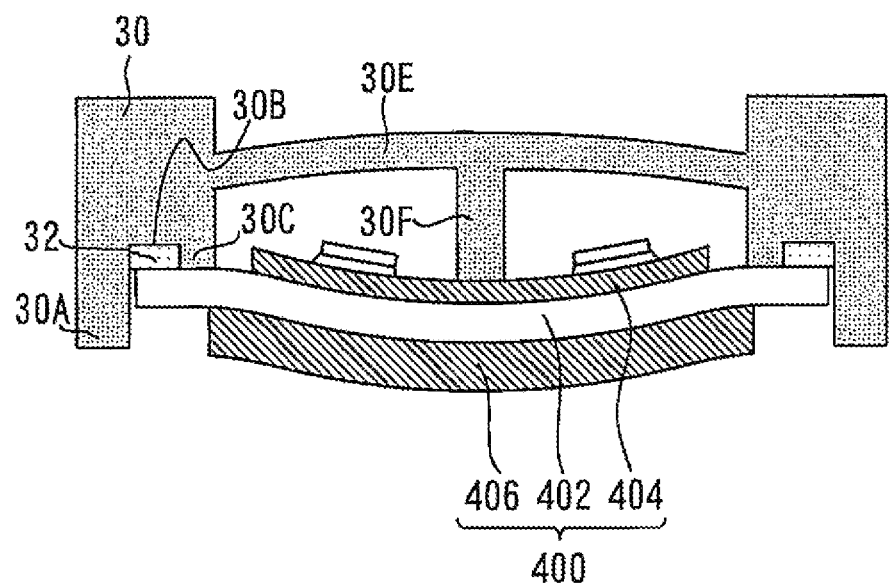
FIG. 23 is a sectional view of the semiconductor device after the removal step.

Next, heat is supplied from the cure base plate 40 to the adhesive 32 to cure the adhesive 32, thereby bonding the case 30 and the substrate 402 together. The adhesive 32 exists between the case 30 and the portion of the upper surface of the substrate 402 outside the portion maintained in contact with the contact portion 30C. This process step is referred to as a bonding step. Subsequently, the case 30 and the insulating substrate 400 are removed from the cure base plate 40. This process step is referred to as a removal step. FIG. 23 is a sectional view of the semiconductor device after the removal step. After removal of the case 30 and the insulating substrate 400 from the cure base plate 40, the insulating substrate 400 is warped so as to be downward convex, while the extension portion 30E is warped so as to be upward convex to a small extent.

For example, in a case where the mount step is executed while the insulating substrate is warped so as to be downward convex, there is a possibility of contact between an end portion of the insulating substrate and the case and, hence, breakage of the insulating substrate. In the semiconductor device manufacturing method according to the eighth embodiment of the present invention, however, the insulating substrate 400 is warped so as to be upward convex, thus enabling prevention of contact between an end portion of the insulating substrate and the case in the mount step.

Since the insulating substrate 400 is pressed against the cure base plate 40 with the pressing portion 30F in the mount step, the warp of the insulating substrate 400 is corrected. After the bonding step, the pressing portion 30F inhibits the insulating substrate 400 from warping so as to be upward convex. After the bonding step, therefore, the insulating substrate 400 has a downward convex warp or is flat, as shown in FIG. 23. In the case where the insulating substrate is warped so as to be downward convex, the metal film 406 and the heat-releasing grease can easily be maintained in intimate contact with each other and, therefore, the amount of the heat-dissipating grease can be reduced in comparison with the case where the insulating substrate is flat.

Ninth Embodiment

Figure 24:
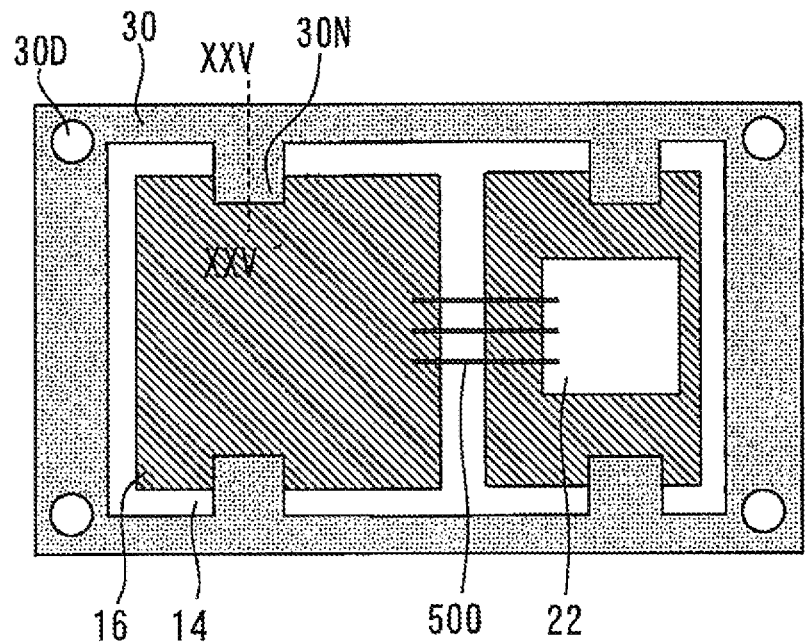
FIG. 24 is a plan view of a semiconductor device according to a ninth embodiment.

FIG. 24 is a plan view of a semiconductor device according to a ninth embodiment of the present invention. Contact portions 30N are formed on the case 30 provided so as to surround the semiconductor element 22 and the insulating substrate. The contact portions 30N abut on the metal pattern 16. The semiconductor element 22 is fixed on the metal pattern 16. The semiconductor element 22 and the metal pattern 16 are connected to each other by wires 500. Since the contact portions 30N abut on the metal pattern 16 on which the semiconductor element 22 is fixed, portions of the insulating substrate close to the semiconductor element 22 are pressed downward by the contact portions 30N when the semiconductor device is fixed on a cure base plate or a heat sink.

Figure 25:
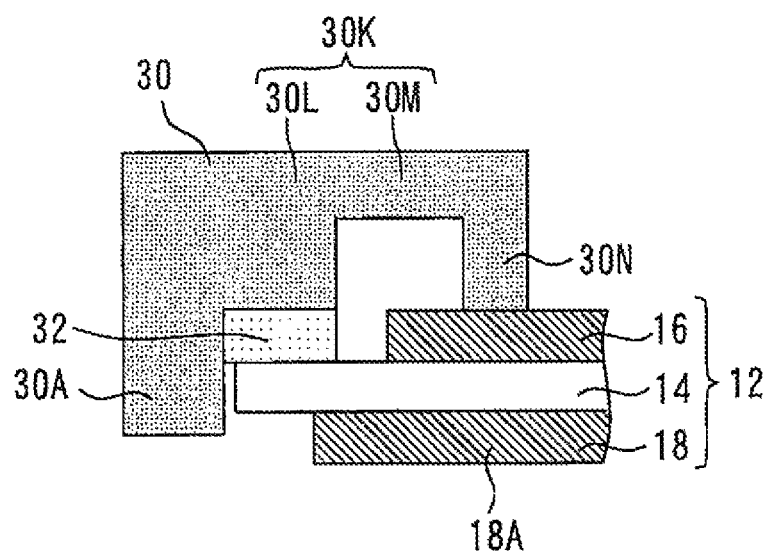
FIG. 25 is a sectional view taken along broken line XXV-XXV' in FIG. 24.

FIG. 25 is a sectional view taken along broken line XXV-XXV' in FIG. 24. The insulating substrate 12 includes the substrate 14, the metal pattern 16 formed on the upper surface of the substrate 14 and the metal film 18 formed on the lower surface of the substrate 14. The case 30 has an outer wall portion 30A surrounding the insulating substrate 12, the contact portions 30N abutting on the metal pattern 16, and noncontact portions 30K connecting the outer wall portion 30A and the contact portions 30N.

Each noncontact portion 30K includes a bonding portion 30L and a bridge portion 30M. The bonding portion 30L and the substrate 14 are bonded to each other with an adhesive 32. The noncontact portion 30K does not directly contact the insulating substrate 12. Only the contact portion 30N of the case 30 directly contacts the insulating substrate 12.

The semiconductor device according to the ninth embodiment of the present invention has the above-described construction. Screws are passed through a plurality of through holes 30D formed in peripheral end portions of the case 30 so as to extend vertically through the case 30, and are fixed threaded holes in the cure base plate or the heat sink. At this time, the contact portions 30N exert forces on the metal pattern 16 to press the insulating substrate 12 downward. The metal film 18 is thereby brought into intimate contact with the cure base plate, the heat sink or heat-dissipating grease.

Since the semiconductor element 22 is a heat generation source, there is apprehension that the displacement of the insulating substrate around the periphery of the semiconductor element 22 is increased. In the semiconductor device according to the ninth embodiment of the present invention, however, the contact portions 30N abut on the metal pattern 16, so that the insulating substrate can be pressed downward at positions closer to the semiconductor element 22 in comparison with the case where the contact portion abuts on the substrate. The reliability of the semiconductor device can therefore be improved by limiting the displacement of the substrate. The rigidity of the insulating substrate 12 can also be improved by providing the metal film 18 in at least part of the regions right below the contact portions 30N. If there is no need to specially improve the rigidity, the provision of the metal film right below the contact portions 30N may not needed.

The contact portion 30C in the first embodiment abuts on the portion of the substrate 14 close to the peripheral end of the substrate 14. There is, therefore, a possibility of concentration of stress in a portion of the substrate close to the peripheral end if the insulating substrate 12 is slanted due to a warp or the like therein. In the semiconductor device according to the ninth embodiment of the present invention, each contact portion 30N contacts not a portion close to the peripheral end of the substrate 14 but the metal pattern 16 at a certain distance from the peripheral end and, therefore, the above-described problem can be avoided.

The feature of the semiconductor device according to the ninth embodiment resides in that the "metal pattern 16" is pressed downward by the contact portions of the case. Various modifications can be made within such bounds that this feature is not lost. The contact portions 30N are brought into abutment on the metal pattern on which the semiconductor element is formed, thereby enabling pressing in the vicinity of the semiconductor element. Even if the contact portions are brought into contact with the metal pattern on which no semiconductor element is formed, the problem of concentration of stress in a portion of the substrate 14 close to the peripheral end can be solved. Thus, the construction is effective. The number of contact portions is not limited to a particular number. The adhesive 32 is provided for the purpose of bonding the noncontact portions 30K and the insulating substrate 12 to each other. Therefore, it is not necessarily required that the adhesive 32 is formed at the outermost position on the noncontact portions 30K. That is, as long as the portion of the upper surface of the substrate 14 outside the contact portions 30N and the case 30 can be bonded to each other, the position of the adhesive 32 is not particularly specified.

Figure 26:
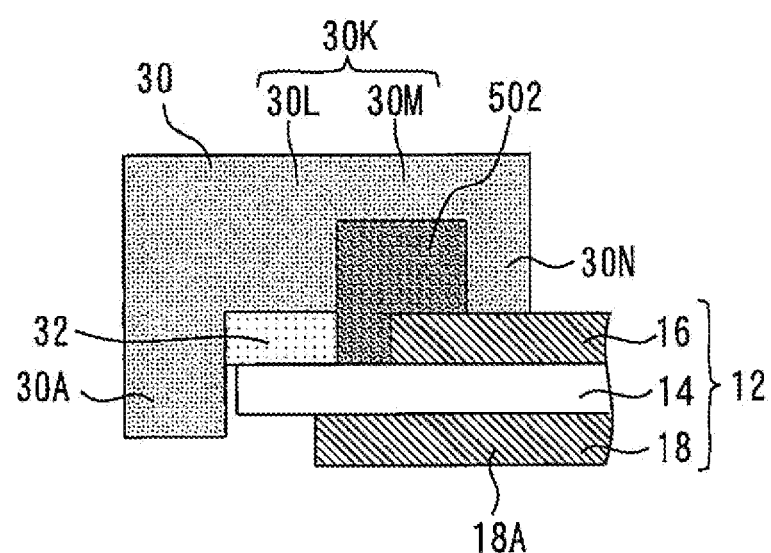
FIG. 26 is a sectional view showing an insulating sealing material.

As can be understood from FIG. 25, placing the contact portions 30N apart from the peripheral end of the substrate 14 requires making the noncontact portions 30K comparatively long. Since there is no need to apply the adhesive to the entire noncontact portions 30K formed long, a vacant space is left immediately below part of each noncontact portion 30K. An insulating sealing material may be provided in this vacant space. FIG. 26 is a sectional view showing an insulating sealing material or the like. Insulating sealing material 502 is provided between the noncontact portion 30K and the insulating substrate 12. The insulating withstand voltage of the semiconductor device can be improved by the insulating sealing material 502. The insulating sealing material is, for example, a gel or a resin.

The features of the semiconductor device described as the ninth embodiment may be used as desired in combination with any of the features of the semiconductor devices according to the embodiments described above.

A combination of the features of the semiconductor devices and the semiconductor manufacturing methods according to the embodiments described above may be made as desired.

According to the present invention, the metal film is provided right below the contact portion, so that the possibility of cracking of the substrate can be reduced.

Obviously many modifications and variations of the present invention are possible in the light of the above teachings. It is therefore to be understood that within the scope of the appended claims the invention may be practiced otherwise than as specifically described.

What is claimed is:
1. A semiconductor device comprising:
an insulating substrate including a substrate, a metal pattern formed on an upper surface of the substrate, and a metal film formed on a lower surface of the substrate;
a semiconductor element fixed on the metal pattern;

a case surrounding the metal pattern and having a continuous contact portion surrounding the periphery of the substrate and maintained in direct continuous contact with the upper surface of the substrate; and an adhesive with which the case and a portion of the upper surface of the substrate outside a portion maintained in contact with the contact portion are bonded together, wherein a plurality of through holes are formed in a peripheral portion of the case, the through holes extending vertically through the case, and wherein the metal film exists in at least part of a place right below the contact portion.

2. The semiconductor device according to claim 1, wherein at least a portion of the lower surface of the substrate is exposed to the outside right below the adhesive.

3. The semiconductor device according to claim 1, wherein the case has:
   an extension portion provided so as to connect two inner wall portions of the case; and
   a pressing portion connected to the extension portion and extending downward,
   wherein the pressing portion is provided in a place surrounded by the contact portion as viewed in plan.

4. The semiconductor device according to claim 1, wherein a plurality of the insulating substrates are provided.

5. The semiconductor device according to claim 4, wherein the plurality of the insulating substrates include a first insulating substrate and a second insulating substrate laterally disposed side by side,
   wherein the case has a right-above-boundary portion above a boundary between the first insulating substrate and the second insulating substrate,
   wherein the right-above-boundary portion has additional contact portions in contact with an upper surface of the first insulating substrate and an upper surface of the second insulating substrate, and
   wherein the right-above-boundary portion is bonded to the first insulating substrate and the second insulating substrate with an adhesive.

6. The semiconductor device according to claim 5, wherein the additional contact portions extend further downward relative to the contact portion.

7. The semiconductor device according to claim 4, wherein the plurality of the insulating substrates include a first insulating substrate and a second insulating substrate laterally disposed side by side, and
   wherein the case has a partition portion positioned between the first insulating substrate and the second insulating substrate.

8. The semiconductor device according to claim 4, wherein the plurality of the insulating substrates include a first insulating substrate and a second insulating substrate laterally disposed side by side,
   wherein the case has a right-above-boundary portion above a boundary between the first insulating substrate and the second insulating substrate,
   wherein the right-above-boundary portion has additional contact portions in contact with an upper surface of the first insulating substrate and an upper surface of the second insulating substrate, and
   wherein an electrode is provided above the right-above-boundary portion.

9. The semiconductor device according to claim 1, wherein each of the metal pattern and the metal film is polygonal as viewed in plan, and
   wherein corners of the metal film and corners of the metal pattern are not vertically overlapped.

10. The semiconductor device according to claim 1, wherein the substrate is formed of SiN.

11. The semiconductor device according to claim 1, wherein a TIM agent applied on the surface of the metal film is provided.

12. The semiconductor device according to claim 1, wherein the metal film is thicker than the metal pattern.

13. The semiconductor device according to claim 1, wherein the semiconductor element is formed of a wide-bandgap semiconductor.

14. The semiconductor device according to claim 13, wherein the wide-bandgap semiconductor is silicon carbide, a gallium nitride-based material or diamond.

15. A semiconductor device comprising:
   an insulating substrate including a substrate, a metal pattern formed on an upper surface of the substrate, and a metal film formed on a lower surface of the substrate;
   a semiconductor element fixed on the metal pattern;
   a case surrounding the metal pattern and having a contact portion maintained in contact with the upper surface of the substrate; and
   an adhesive with which the case and a portion of the upper surface of the substrate outside a portion maintained in contact with the contact portion are bonded together,
   wherein a plurality of through holes are formed in a peripheral portion of the case, the through holes extending vertically through the case,
   wherein the metal film exists in at least part of a place right below the contact portion, and
   wherein the contact portion contacts the upper surface of the substrate while avoiding contact with corner portions of the substrate as viewed in plan, and
   no portion of the case other than the contact portion directly contacts the insulating substrate.

16. A semiconductor device comprising:
   an insulating substrate including a substrate, a metal pattern formed on an upper surface of the substrate, and a metal film formed on a lower surface of the substrate;
   a semiconductor element fixed on the metal pattern;
   a case having a contact portion maintained in direct contact with an upper surface of the metal pattern, and an outer wall portion surrounding the insulating substrate, the case surrounding the semiconductor element; and
   an adhesive with which a portion of the upper surface of the substrate outside the contact portion and the case are bonded to each other,
   wherein a plurality of through holes, formed so as to extend vertically through the case, are formed in peripheral portions of the case, and
   no portion of the case other than the contact portion directly contacts the insulating substrate.

17. The semiconductor device according to claim 16, wherein the case includes:
   an outer wall portion surrounding the insulating substrate; and
   a noncontact portion connecting the outer wall portion and the contact portion, the noncontact portion not directly contacting the insulating substrate, and
   wherein the adhesive bonds to the noncontact portion.

18. The semiconductor device according to claim 17, further comprising an insulating sealing material provided between the noncontact portion and the insulating substrate.

19. The semiconductor device according to claim 16, wherein the metal film exists in at least part of a region right below the contact portion.

* * * * *